(12) United States Patent
Balch et al.

(10) Patent No.: US 6,559,631 B1
(45) Date of Patent: May 6, 2003

(54) TEMPERATURE COMPENSATION FOR AN ELECTRONIC ELECTRICITY METER

(75) Inventors: Richard A. Balch, North Hampton, NH (US); David D. Elmore, Somersworth, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/058,543

(22) Filed: Apr. 10, 1998

(51) Int. Cl.[7] .............................................. G01R 21/06
(52) U.S. Cl. ................... 324/142; 324/105; 324/117 R; 324/117 H
(58) Field of Search ................................ 324/116, 142; 702/61; 331/173; 374/109; 340/637, 870.1, 870.02, 310

(56) References Cited

U.S. PATENT DOCUMENTS

| | | | | |
|---|---|---|---|---|
| 2,900,603 A | * | 8/1959 | Mindt et al. | 324/105 |
| 3,813,927 A | * | 6/1974 | Furgason | 324/65 |
| 4,644,320 A | * | 2/1987 | Carr et al. | 340/310 |
| 4,701,698 A | * | 10/1987 | Karlsson et al. | 324/116 |
| 4,702,617 A | * | 10/1987 | Crabtree et al. | 374/109 |
| 4,998,061 A | * | 3/1991 | Voisine et al. | 324/142 |
| 5,245,275 A | * | 9/1993 | Germer et al. | 324/142 |
| 5,462,225 A | * | 10/1995 | Massara et al. | 236/47 |
| 5,617,084 A | * | 4/1997 | Sears | 340/870.02 |
| 5,673,196 A | * | 9/1997 | Hoffman et al. | 364/483 |
| 5,742,512 A | * | 4/1998 | Edge et al. | 364/480 |
| 5,889,442 A | * | 3/1999 | Ouellette et al. | 331/173 |
| 5,924,051 A | * | 7/1999 | Provost et al. | 702/61 |
| 5,924,486 A | * | 7/1999 | Ehlers et al. | 236/46 |
| 5,963,146 A | * | 10/1999 | Johnson et al. | 340/870.01 |

* cited by examiner

Primary Examiner—Kamand Cuneo
Assistant Examiner—Jimmy Nguyen
(74) Attorney, Agent, or Firm—Karl A. Vick, Esq.; Armstrong Teasdale LLP

(57) ABSTRACT

An electricity meter which, in one embodiment, includes a temperature sensing unit for determining a signal representative of the temperature within the meter is described. In the one embodiment, the meter includes a current sensor, a voltage sensor and a processing unit. The current sensor generates an signal representative of a line current and the voltage sensor generates a signal representative of a line voltage. The current and voltage sensor and temperature sensing unit outputs are coupled to the processing unit. The processing unit includes an analog to digital (A/D) converter, a digital signal processor (DSP) and a microcomputer. The digital outputs of the A/D converter are connected to the DSP. The outputs of the DSP are connected to the microcomputer. Temperature characteristics of the meter are stored within the DSP. In operation, the output signals from the current sensor and the voltage sensor are sampled by the A/D converter to generate digital output signals representative of the line current and the line voltage. The output of the sensing unit is sampled by the A/D converter to generate a digital output signal representative of the temperature within the meter. The A/D converter digital output signals are transmitted to the DSP. The DSP determines if the output signal representative of the temperature within the meter is within a valid range. If the temperature signal is within the valid range, the DSP adjusts the line current and line voltage by the temperature characteristics of the meter based on the temperature representative signal. An adjusted energy consumption value is then determined by the DSP using the adjusted line current and the adjusted line voltage.

14 Claims, 4 Drawing Sheets

TEMPERATURE COMPENSATION FOR AN ELECTRONIC ELECTRICITY METER

FIELD OF THE INVENTION

This invention relates generally to electricity metering and more particularly, to an electronic electricity meter configurable to compensate for temperature of the meter.

BACKGROUND OF THE INVENTION

Electronic electricity meters operate in various environments to measure and record energy consumption. For example, electricity meters are often installed on the outside of a customer's structure to allow easy access to the meter. As a result, components of the meter are exposed to temperature changes caused by the weather. In order to accurately measure the amount of energy consumed by the customer, the internal components of the meter must have high accuracy and low sensitivity to temperature changes.

These low temperature coefficient components maintain the accuracy of the meter despite the temperature variations of the environment. Using such low temperature coefficient components, however, increases the cost of the electricity meter.

It would be desirable to provide a meter which automatically compensates energy consumption measurements for temperature changes so that higher temperature coefficient components can be used in the meter.

SUMMARY OF THE INVENTION

These and other objects may be attained by an electricity meter which, in one embodiment, includes a temperature sensing unit for generating a signal representative of the temperature within the meter. The electricity meter further includes a current sensor, a voltage sensor and a processing unit connected to the outputs of the current sensor, the voltage sensor and the temperature sensing unit.

In operation, the processing unit samples the analog output signals from the current sensor and the voltage sensor to determine a line current signal and a line voltage signal. The processing unit also samples the output of the sensing unit. If the temperature signal is within a valid range, the processing unit adjusts the line current and line voltage signals for temperature characteristics based on the temperature representative signal. The adjusted line current and line voltage signals are then utilized within the processing unit to determine the adjusted energy consumption of the load.

If the temperature representative signal is outside the valid range, the processing unit does not adjust the line current and line voltage signals and the energy consumption is determined using the line current and line voltage signals with no temperature adjustment. If the temperature signal is outside the valid range, such condition may mean that the temperature sensing unit is not properly operating.

The above-described meter provides a temperature sensing unit which measures the meter temperature inside the meter so that the line current and line voltage signals may be adjusted to compensate for the temperature characteristics of the meter. Such adjustment for the temperature characteristics of the meter enables use of higher temperature coefficient components, therefore reducing the cost of the meter.

DETAILED DESCRIPTION

Figure 1:
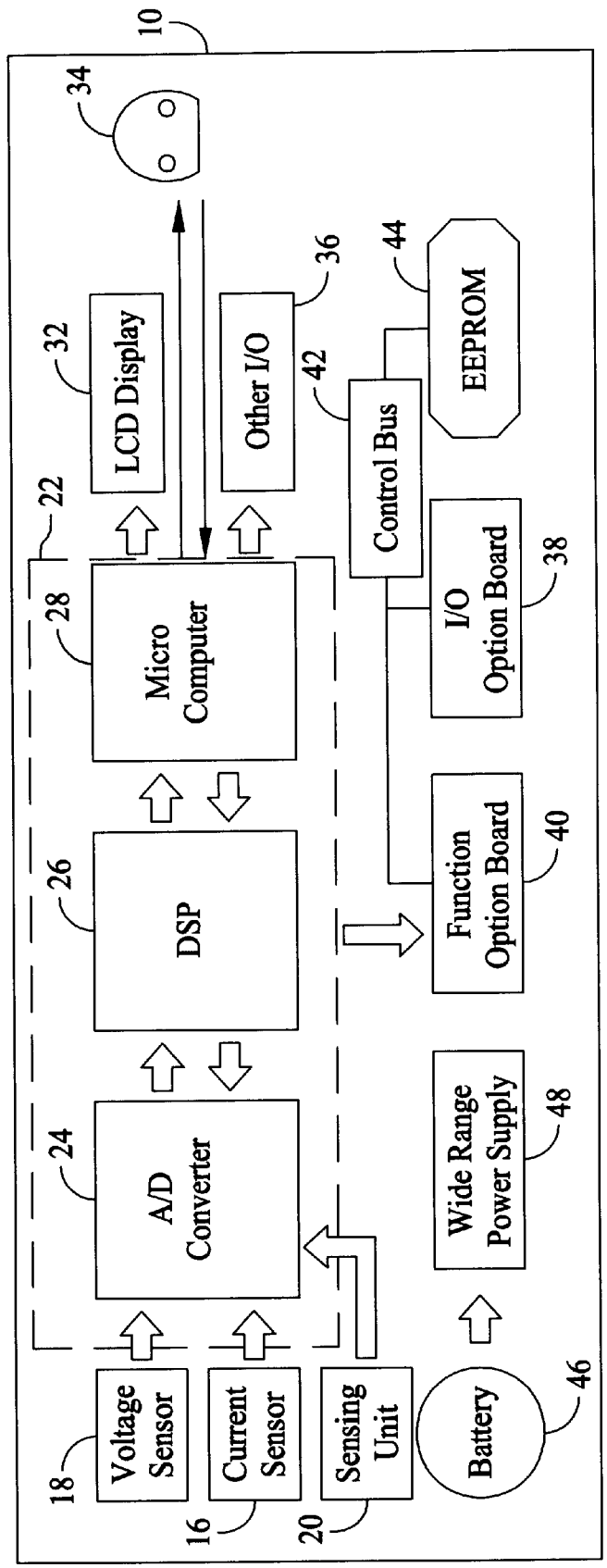
FIG. 1 is a circuit schematic diagram of an electronic electricity meter.

FIG. 1 is a circuit schematic diagram representation of meter 10. Meter 10 includes at least one current sensor 16 and at least one voltage sensor 18. Current sensor 16 generates a signal representative of a line current. Voltage sensor 18 generates a signal representative of a line voltage. Sensors 16 and 18, in operation, typically are coupled to the power lines supplying power to site at which meter 10 is located. Meter 10 further includes a temperature sensing unit 20 located within the enclosure of meter 10. Sensing unit 20 generates a signal representative of a temperature at a location within the meter enclosure.

Meter 10 further includes a processing unit 22. Processing unit 22 determines energy consumption of the load using the output signals of current sensor 16 and voltage sensor 18 based on the temperature characteristics of meter 10. Specifically, meter 10 includes many components that may be affected by temperature. For example, the accuracy of current sensor 16 and a voltage reference circuit (not shown) may be affected by the temperature within meter 10. Processing unit 22 utilizes the temperature representative signal of sensing unit 20 to adjust the energy consumption calculations to compensate for the temperature characteristics of the materials and components in meter 10.

More particularly, processing unit 22 includes an analog to digital (A/D) converter, or data acquisition platform (DAP), 24, a digital signal processor (DSP), or processor, 26, and a microcomputer 28. A/D converter 24 converts the analog input signals from current sensor 16, voltage sensor 18 and sensing unit 20 to digital output signals. The digital output signals of A/D converter 24 are connected to DSP 26. DSP 26 processes the digital signals received from A/D converter 24 and supplies microcomputer 28 with digitized metering quantities, e.g., $V^2H$, $I^2H$. Microcomputer 28, using the metering quantities supplied by DSP 26, performs additional metering calculations and functions as known in the art. DSP 26 may, for example, be a processor commercially available as Model Number TMS320 from Texas Instruments Company, P.O. Box 6102, Mail Station 3244, Temple, Tex. 76503, modified to perform metering functions.

Microcomputer 28 is coupled to a liquid crystal display 32 to control the display of various selected metering quantities and to an optical communications port 34 to enable an external reader to communicate with computer 28. Port 34 may be the well known OPTOCOM™ port of General Electric Company, 130 Main Street, Somersworth, N.H. 03878, which is in accordance with the ANSI type II optical port. Microcomputer 28 may also generate additional outputs 36 used for various other functions as is well known in the art. Microcomputer 28 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 28 also is coupled to an input/output (I/O) board 38 and to a function, or high function, board 40. DSP 26 also supplies outputs directly to high function board 40. Microcomputer 28 further is coupled, via a control bus 42, to an electronically erasable programmable read only memory (EEPROM) 44. I/O board 38 and high function board 40 also are coupled, via bus 42, to EEPROM 44.

Back-up power is supplied to the meter components described above by a battery 46 coupled to a wide range power supply 48. In normal operation when no back-up power is required, power is supplied to the meter components from the power lines via power supply 48.

The present invention is directed to the methods and apparatus for adjusting the line voltage, and current signals based upon the temperature characteristics of meter 10 as described below in more detail. In addition, although the methods and apparatus are described below in the hardware environment shown in connection with FIGS. 1 and 2, it should be understood that such methods and apparatus are not limited to practice in such environment. The subject methods and apparatus could be practiced in many other environments.

Further, it should be understood that the present invention can be practiced with many alternative processing units or processors, and is not limited to practice in connection with just processing unit 22. Therefore, and as used herein, the term processing unit is not limited to mean just those integrated circuits referred to in the art as microcomputers, but broadly refers to microcomputers, processors, microcontrollers, application specific integrated circuits, and other programmable circuits.

Figure 2:
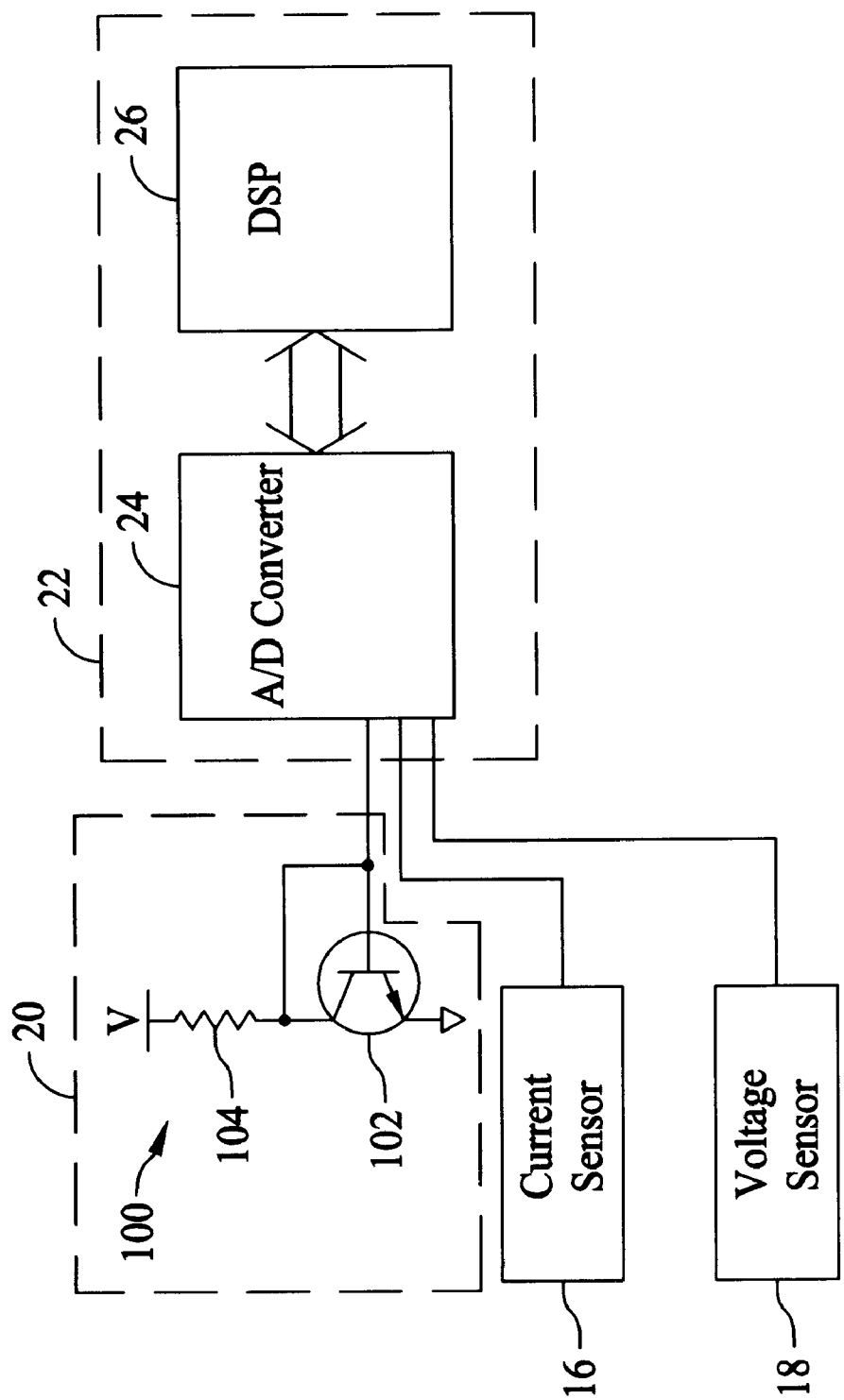
FIG. 2 is a schematic diagram of the temperature sensing unit shown in FIG. 1.

Referring now specifically to FIG. 2, temperature sensing unit, or circuit, 20 includes a temperature element 100 for generating the signal representative of the temperature within the enclosure of meter 10. The output signal of element 100 is connected to processing unit 22, specifically an input of A/D converter 24. In one embodiment, temperature element 100 includes a transistor 102 and a resistor 104. Resistor 104, in one embodiment, is a 2.26 kilo-ohms resistor and transistor 100 is a MMBT2N3904 silicon transistor. Resistor 104 is connected to a supply voltage V. Base of transistor 102 is connected to the junction of resistor 104, collector of transistor 102 and an input of processing unit 22. The signal present at base of transistor 102 is the signal representative of the temperature within the enclosure of meter 10. Emitter of transistor 102 is connected,to ground.

In an alternative embodiment, the device selected for element 100 may include other temperature sensitive circuits, or devices that produce an output that is representative of the temperature within meter 10. For example, transistor 102 may be replaced by a thermistor (not shown) having two leads. The first lead is connected to ground. The second lead is connected to the junction of resistor 104 and the input of A/D converter 24. Many other types of temperature sensitive devices and circuits exist and may be used.

DSP 26 includes a random access memory (RAM) (not shown) and a read only memory (ROM) (not shown). Inputs to DSP 26 include the digital output signals from A/D converter 24 which are transmitted from converter 24 to DSP 26 at a defined rate, for example 3900 bits per second. The digital output signals from A/D converter 24 are at least temporarily stored in the RAM for further processing.

Figure 3:
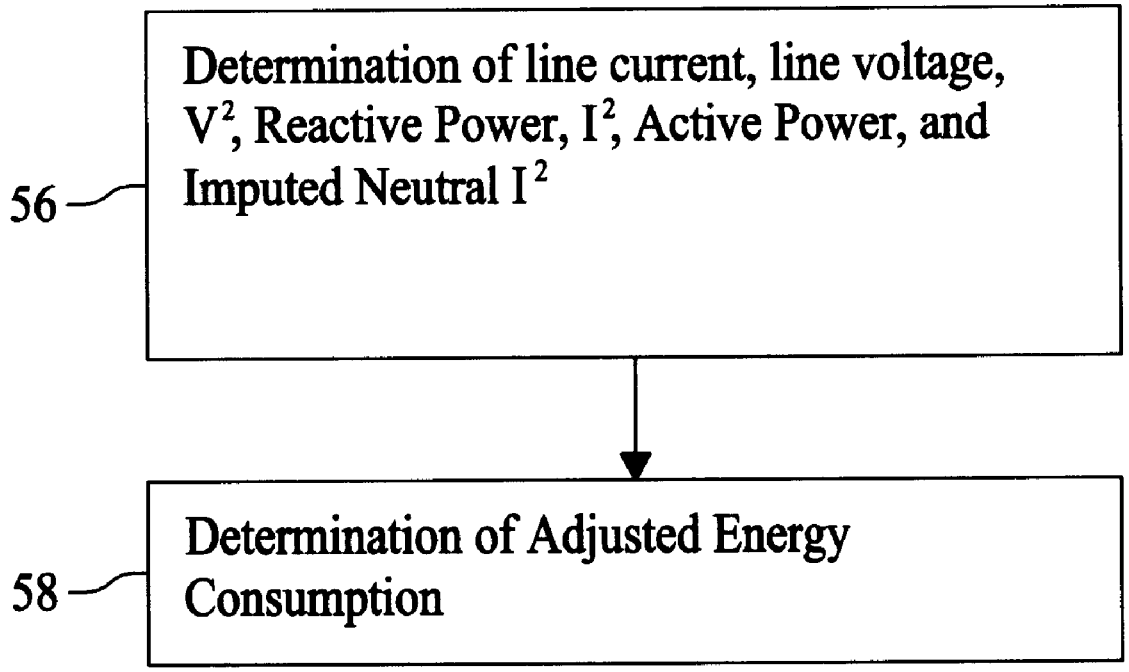
FIG. 3 is a flow chart illustrating processing steps executed by the meter processing unit.

As illustrated in FIG. 3, a number of instruction sets 56 and 58 are stored in ROM of DSP 26. Set 56 includes the processing steps to determine the line current, the line voltage, $V^2$, Reactive Power, $I^2$, Active Power, and Imputed Neutral $I^2$, as known in the art. Set 58 includes the processing steps utilized by DSP 26 for determining an adjusted energy consumption including adjusting the measured line current and line voltage signals to adjust for the temperature characteristics within meter 10.

In determining the temperature characteristics of meter 10, the accuracy, or error, of meter 10 must be determined for all temperatures within a valid temperature range. These temperature characteristics are then converted into an algorithm stored in ROM of DSP 26 so that the proper adjustment is made at any valid meter temperature. For example, if meter 10 is known to generate an energy consumption value that is 1% below the actual energy consumption when the internal meter temperature is 5 degrees F., DSP 26 adjusts the measured line current and line voltage signals to correct for the temperature characteristics of meter 10 at 5 degrees F.

In operation, processing unit 22 determines the value of the line current from the output of current sensor 16 and the value of the line voltage from the output of voltage sensor 18. Processing unit 22 also determines the value of the signal representative of the temperature within meter 10. If the temperature representative signal is within a valid range, processing unit 22 generates an adjusted energy consumption by adjusting the value of the line current and the line voltage based on the temperature characteristics of meter 10. Specifically, DSP 26 transmits the appropriate command to A/D converter 24 to control selection of the inputs to A/D converter 24 and the frequency at which the A/D converter inputs are sampled. A/D converter 24 samples and converts the analog signals from sensors 16 and 18 and sensing unit 20 into at least one digital output signal. In one embodiment, the analog signals from sensors 16 and 18 are individually sampled and converted by A/D converter 24 into separate digital outputs representing the line current (i.e. XA) and the line voltage (i.e. XV). The digital output signals XA and XV from A/D converter 24 are then transmitted to DSP 26 for determining the energy consumption of the load. The digital output signal XA and XV are stored in RAM of DSP 26.

DSP 26, under control of instruction set 58, samples the temperature representative signal of sensing unit 20 and determines the appropriate energy consumption based on the temperature of meter 10. Specifically, DSP 26 commands A/D converter 24 to sample the temperature representative signal of sensing unit 20 to generate TEMP_F1 200 in a manner similar to the sampling of current sensor 16. The output of sensing unit 20 may require less frequent sampling as a result of the relatively slow temperature change of meter 10. For example, the output of sensing unit 20 may only be required to be sampled at $\frac{1}{10}$ or $\frac{1}{100}$ of the sampling rate of current sensor 16 and voltage sensor 18.

The value of TEMP_F1 is then tested to determine if TEMP_F1 is within a valid range 204. If TEMP F1 is within the valid range, DSP 26 adjusts the digital signals representative of the measured line current XA and line voltage XV for the temperature characteristics of meter 10 based on the value of TEMP_F1 208. A temperature adjusted energy consumption value is then determined using the adjusted line current and the adjusted line voltage 212. Specifically, in one embodiment, adjusted line current (i.e., Adjusted XA) and adjusted line voltage (i.e., Adjusted XV) are determined as follows:

Adjusted $XA=Tc*XA$

Adjusted $XV=Tc*XV$ where:

Tc=$A*\text{TEMP\_F1}^2+B*\text{TEMP\_F1}+C$

A, B, and C are selected based on the temperature characteristics of the meter.

For example, where A=−0.2168, B=0.2288, C=0.9394, XA=100 and XV=110, Adjusted XA=99.8632 and Adjusted XV=109.8495. Adjusted XA and Adjusted XV are then used to determine the temperature adjusted energy consumption value.

If, however, TEMP_F1 is beyond, either above or below, the valid range, DSP 26 utilizes the measured line current XA and line voltage XV, without adjusting for temperature characteristics of meter 10, to determine energy consumption 216. The testing of the temperature representative signal TEMP_F1 prevents the energy consumption from being adjusted for improper temperature signals. For example, if sensing unit 20 fails and generates an improper output signal, DSP 26 would determine the invalidity of the temperature representative signal and determine energy consumption using the measured values of line current and line voltage.

Meter 10, by using the temperature characteristic adjusted line current and line voltage, generates a more accurate energy consumption value. In addition, because meter 10 compensates for the accuracy errors generated as a result of the temperature changes in meter 10, less expensive components and materials can be utilized in meter 10 while maintaining or improving the accuracy of meter 10. For example, a voltage reference circuit having a higher temperature coefficient may be used, after determining the temperature characteristics of meter 10, without adversely impacting the accuracy of meter 10.

Figure 4:
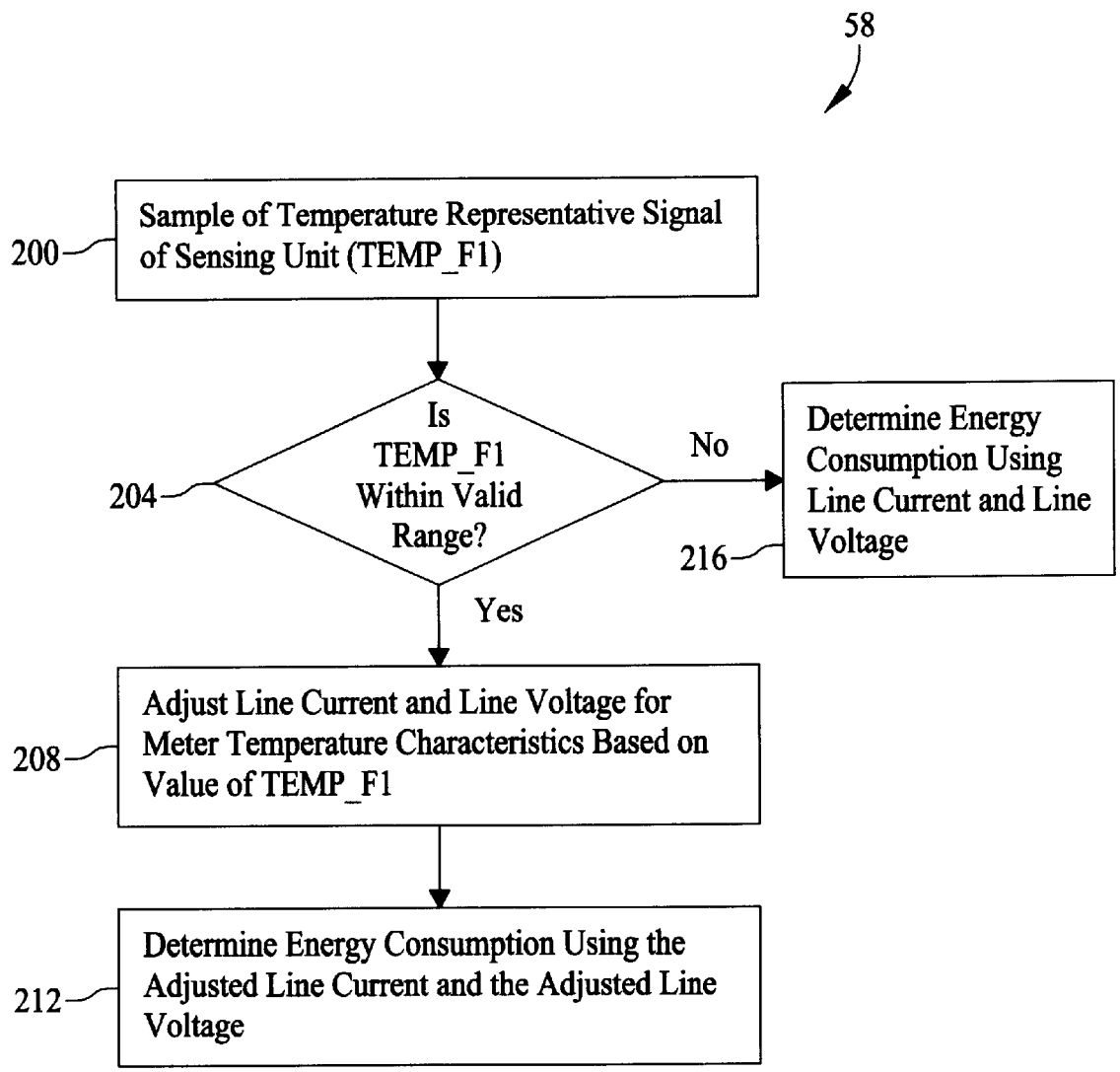
FIG. 4 is a flow chart illustrating processing steps for determining an adjusted energy consumption.

Of course, the present invention is not limited to the specific processing steps illustrated in FIGS. 3 and 4, and it is possible to use other processing steps even for the same meter applications depending on the standard calculation methodology selected. Although only one voltage and one current sensor are described, multiple current and voltage sensors may be used. For example, in a multi-phase meter, separate current and voltage sensors may be used for each phase to determine the total energy or power consumption. Further, although only one temperature representative signal is described above, the meter could include a plurality of temperature representative signals. These signals could be used to sense the temperature at multiple locations within the meter. For example, a temperature representative signal could be generated for each voltage sensor and each current sensor so that the output of each sensor could be independently adjusted.

The above-described meter includes a temperature sensing unit which measures the meter temperature inside the meter so that the line current and line voltage signals may be adjusted to compensate for the temperature characteristics of the meter. Adjusting for the temperature characteristics of the meter allows higher temperature coefficient components to be used, therefore reducing the cost of the meter.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. For example, instead of adjusting the line current and line voltages, the meter could adjust the value of the generated energy consumption. Accordingly, the spirit and scope of the invention are to be limited only by the terms of the appended claims.

What is claimed is:

1. An electricity meter comprising:
an enclosure comprising a base and a cover;
a processing unit within said enclosure for determining energy consumption; and
a temperature sensing unit within said enclosure for generating a temperature signal representative of a temperature within said enclosure, said temperature signal coupled to said processing unit, said processing unit configured to adjust said energy consumption based on said sensing unit temperature signal.

2. An electricity meter in accordance with claim 1 wherein said meter further comprises at least one current sensor for generating a signal representative of a line current, said current signal coupled to said processing unit.

3. An electricity meter in accordance with claim 2 wherein said meter further comprises at least one voltage sensor for generating a signal representative of a line voltage, said voltage signal coupled to said processing unit.

4. An electricity meter in accordance with claim 3 wherein said processing unit comprises an analog digital converter configured to convert said current, voltage and temperature signals to digital output signals.

5. An electricity meter in accordance with claim 4 wherein said processing unit further comprises a processing electrically coupled to said digital output signals.

6. An electricity meter in accordance with claim 5 wherein said processor comprises a memory having stored therein an instruction set for adjusting said voltage signal and said current signal based on said temperature signal.

7. An electricity meter in accordance with claim 1 wherein said processing unit comprises a memory having stored therein an instruction set for adjusting energy consumption calculations based on a temperature within the meter.

8. An electricity meter in accordance with claim 7 wherein said processing unit to perform energy consumption calculations by executing said instruction set for adjusting said energy consumption calculations based on the temperature within the meter.

9. An electricity meter in accordance with claim 1 wherein said processing unit further comprises an input configured to be coupled to said temperature sensing unit operable to transmit a temperature signal representative of a temperature within the meter to said processing unit.

10. An electricity meter according to claim 1 wherein said processing unit further comprises at least one input configured to be coupled to a current sensor to transmit a line current signal to said processing unit.

11. An electricity meter according to claim 1 wherein said processing unit further comprises at least one input configured to be coupled to a voltage sensor to transmit a line voltage signal to said processing unit.

12. An electricity meter according to claim 1 wherein said temperature sensing unit further comprises a temperature element configured to generate the signal representative of the temperature.

13. An electricity meter according to claim 12 wherein said temperature element comprises a transistor having an output representative of the temperature within the meter.

14. An electricity meter according to claim 12 wherein said temperature element comprises a thermistor having an output representative of the temperature within the meter.

* * * * *